United States Patent [19]

Nishiguchi et al.

[11] Patent Number: 5,196,726
[45] Date of Patent: Mar. 23, 1993

[54] SUBSTRATE FOR PACKAGING A SEMICONDUCTOR DEVICE HAVING PARTICULAR TERMINAL AND BUMP STRUCTURE

[75] Inventors: Masanori Nishiguchi; Atsushi Miki, both of Yokohama, Japan

[73] Assignee: Sumitomo Electric Industries, Ltd., Osaka, Japan

[21] Appl. No.: 644,846

[22] Filed: Jan. 23, 1991

[30] Foreign Application Priority Data

Jan. 23, 1990 [JP] Japan ................................. 2-13414
Jan. 23, 1990 [JP] Japan ................................. 2-13415
Jan. 23, 1990 [JP] Japan ................................. 2-13416

[51] Int. Cl.$^5$ .................... H01L 23/14; H01L 23/54
[52] U.S. Cl. .................................... 257/737; 257/780
[58] Field of Search ............... 174/255, 258, 259, 267, 174/268; 357/80, 67, 68; 361/406; 228/180.2, 180.1

[56] References Cited

U.S. PATENT DOCUMENTS

| 4,818,728 | 4/1989 | Rai et al. ........................... 228/180.2 |
| 4,914,814 | 4/1990 | Behun et al. ........................ 361/406 |
| 4,940,181 | 7/1990 | Juskey et al. ....................... 361/406 |
| 4,998,665 | 3/1991 | Hayashi ............................. 228/180.1 |

FOREIGN PATENT DOCUMENTS

0256141  10/1989  Japan ................................. 228/180.2

Primary Examiner—Rolf Hille
Assistant Examiner—S. V. Clark
Attorney, Agent, or Firm—Cushman, Darby & Cushman

[57] ABSTRACT

A substrate for packaging a semiconductor device having a bump thereon according to the present invention is characterized by that the substrate has an electrode terminal to which the bump is to be connected, the electrode terminal has a recess formed thereon to the receive at least a top of the bump, and at least a top of the surface of the electrode terminal is covered by a metal layer having a lower melting point than that of the bump.

15 Claims, 5 Drawing Sheets

SUBSTRATE FOR PACKAGING A SEMICONDUCTOR DEVICE HAVING PARTICULAR TERMINAL AND BUMP STRUCTURE

BACKGROUND OF THE INVENTION

1. Field of the Invention

The present invention relates to a substrate for packaging a semiconductor device such as an IC chip.

2. Related Background Art

In packaging a semiconductor device such as an IC, it has been practiced to form a convex bump on an electrode pad of the semiconductor device and directly connect the bump to an electrode terminal formed on the substrate.

In the past, the electrode terminal on the substrate has been formed flat. Thus, if the bump on the semiconductor device is not exactly positioned at the material will swell out to a periphery of the electrode terminal and may shorten the adjacent electrode terminals.

Further, the higher the interaction density of the semiconductor device is, the smaller are the size and pitch of the electrode terminals formed on the substrate. As a result, as the integration density goes higher, it is necessary to more precisely position the bump to the electrode terminal.

However, such a high precision positioning requires a longer time, and the packaging time increases and a high precision and expensive positioning machine is required. As a result, the packaging cost increases.

SUMMARY OF THE INVENTION

It is an object of the present invention to shorten the time required for packaging and reduce the packaging cost.

In order to achieve the above object, in the substrate for packaging the semiconductor device of the present invention, a recess for receiving at least a top of a bump on the semiconductor device is formed in an electrode terminal on the substrate, and at least the recess of the surface of the electrode terminal is covered by conductive member such as a metal layer having a lower melting a point than that of the bump.

By melting conductive member, such as a low melting point metal, layer on the surface of the electrode terminal after coarse positioning, the bump on the semiconductor device is induced into the recess of the electrode terminal by a surface tension of the conductive member, such as a low melting point metal, so that the bump is exactly positioned for the electrode terminal. And the substrate for packaging the semiconductor device of the present invention, a recess for receiving at least a top of a bump is formed on or in the surface of the electrode terminal on the substrate in such a manner that a depth of the recess increases as it goes from a periphery to a center, and the center of the recess of the electrode terminal is made of a conductive member such as a metal having a lower melting point than that of the periphery.

By merely pushing the semiconductor device to the substrate the coarse positioning, the bump on the semiconductor device is precisely positioned to the electrode terminal on the substrate. Further, by melting the conductive member such as a low melting point metal at the center of the recess of the electrode terminal, the bump on the semiconductor device is induced into the center of the electrode terminal on the substrate by the surface tension of the low melting point metal so that the bump and the electrode terminal are positioned more precisely. Further, in the method for packaging the semiconductor device of the present invention, a recess for receiving a top of a bump on the semiconductor device is formed in an electrode terminal on the packaging substrate, a conductive member such as a low melting point metal is arranged at at least center of the recess, and the packaging substrate is heated while cooling gas is blown to the surface of the packaging substrate.

By merely pushing the semiconductor device to the packaging substrate after the coarse positioning, the bump on the semiconductor device can be precisely positioned to the electrode terminal on the packaging substrate. Further, since only the conductive member such as a low melting point metal at the center of the recess of the electrode terminal can be molten, the bump on the semiconductor device is induced into the center of the electrode terminal on the molten low melting point metal and the bump is more precisely positioned to the electrode terminal.

Alternately, the positioning of the bumps and the recesses can be reversed. For example, the packaging structure of the semiconductor device could include a packaging substrate having a bump projecting from a surface thereof. An electrode pad formed on a semiconductor device can include an electrode pad having a recess for receiving at least a top of the bump projecting from the surface on the packaging substrate. Also, a conductive material of a lower melting point than that of the bump can be formed on the recess.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

Figure 2:
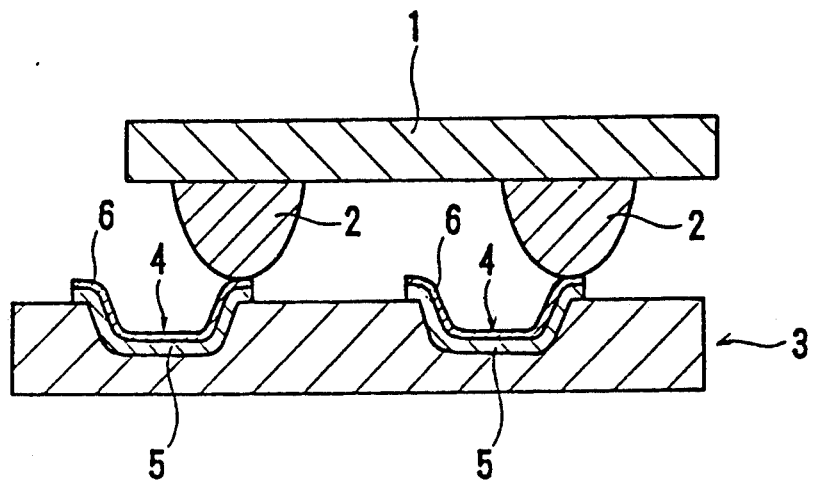
FIG. 2 shows a semiconductor device having coarsely positioned to an electrode terminal of a substrate according to the first embodiment for packaging the semiconductor device in cross section on the perpendicular direction to the substrate surface.
Figure 3:
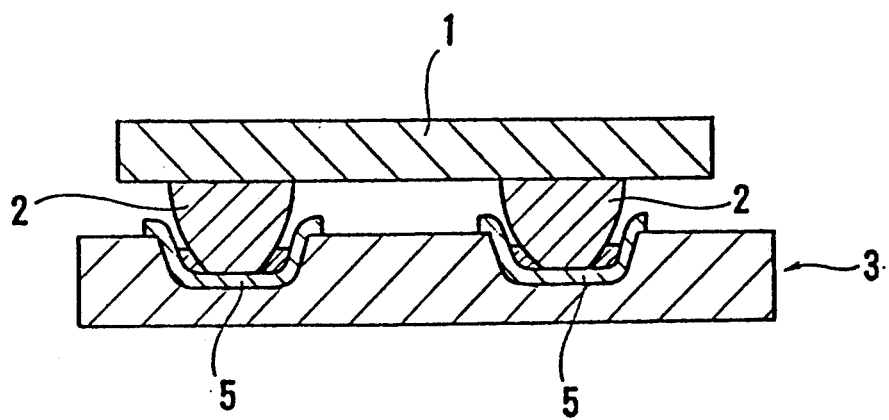
FIG. 3 shows a structure according to the first embodiment after the packaging in cross section on the perpendicular direction to the substrate surface.

The first embodiment of the present invention is now described with reference to FIGS. 1 to 3.

Figure 1A:
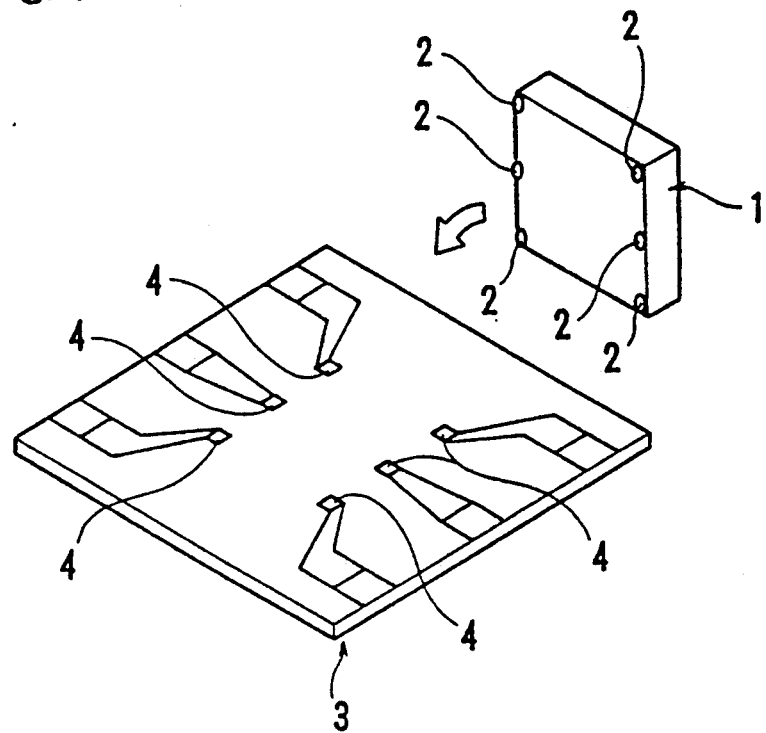
FIG. 1A and 1B show a process for connection of a semiconductor device to a packaging substrate according to the first embodiment of the present invention.
Figure 1B:
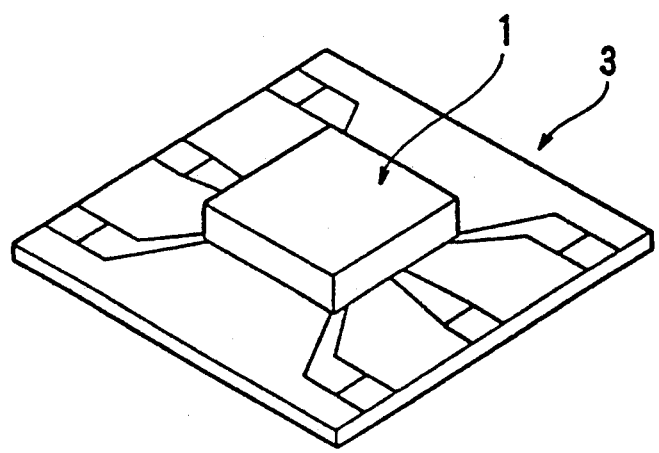

As shown in FIGS. 1A and 1B, a plurality of bumps 2 are formed on the surface of the semiconductor device 1 to project therefrom.

On the other hand, a plurality of electrode terminals 5 corresponding to the bumps on the semiconductor devices 1 are formed on the substrate 3 to which the semiconductor device 1 is to be packaged. Each of the electrode terminals 5 has a recess 4 formed thereon to receive at least a top of the bump 2. The electrode terminal 5 may, for example, be formed in the following manner. First, a recess is formed at an area of the substrate 3 at which the electrode terminal 5 is to be formed. The recess is large enough to receive at least the top (bottom in the drawing) of the bump 2 formed on the semiconductor device 1. The recess is selectively plated to form the electrode terminal 5. The electrode terminal 5 thus formed has the recess 4 for receiving at least the top of the bump 2 on the surface thereof. At least the recess 4 of the surface of the electrode 5 is covered by a metal layer 6 made of a metal (for example, Au/20%Sn, Pb/40%In) having a lower melting point than those of the bump 2 and the electrode terminal 5. The metal layer 6 is formed by a vacuum deposition method. It is preferable that a center of the electrode terminal 5 coincides to a deepest (lowest) position of the recess 4.

When the semiconductor device 1 is to be packaged to the substrate 3 thus formed, the bump 2 on the semiconductor device 1 is positioned to the electrode terminal 5 on the substrate by a positioning machine (not shown). This positioning may be coarse to assure that a portion of the bump 2 abuts the metal layer 6 as shown in FIG. 2, because when the substrate 3 is heated after the positioning to melt only the metal layer 6, the molten metal layer material contracts by the surface tension, and if the top of the bump 2 is on the metal layer 6, the bump 2 is induced into the recess 4 by the surface tension and it is exactly positioned to the electrode terminal 5 as shown in FIG. 3. The surface tension functions to minimize a surface area of the metal layer material between the electrode pad (not shown) on the semiconductor device on which the bump 2 is formed and the electrode terminal 5 on the substrate 3. Accordingly, the semiconductor device 1 is positioned to the substrate 3 by the surface tension such that a total positional error between the electrode pad on the semiconductor device 1 and the electrode terminal 5 on the substrate 3 is minimized. After such exact positioning, the substrate 3 may be further heated to melt the bump 2 to interconnect the bump 2 and the electrode terminal 5, or the bump 2 may not be molten but it may be connected by the molten metal layer material.

The size of the bump 2 formed on the semiconductor device 1 was 80 μm in diameter and approximately 30 μm in height. A size of the electrode terminal 5 on the substrate 3 was 100 μm in diameter. The metal layer 6 was formed on the entire surface of the electrode terminal 5 and the semiconductor device 1 was packaged on the substrate 3. In this case, a positioning precision required for the positioning machine in order to keep the positional error between the bump 2 and the electrode terminal 5 after the packaging within ±10 μm was ±50 μm.

On the other hand, the same semiconductor device as that of the above example was packaged on a prior art substrate having a flat electrode terminal of the same dimension as that of the above example. The precision required for the positioning machine was +/−10 μm. The result is shown below.

|  | Present invention | Prior art |
| --- | --- | --- |
| Precision of positioning machine | +/− 50 μm | +/− 10 μm |
| Positional error after packaging | +/− 10 μm | +/− 10 μm |

Figure 4:
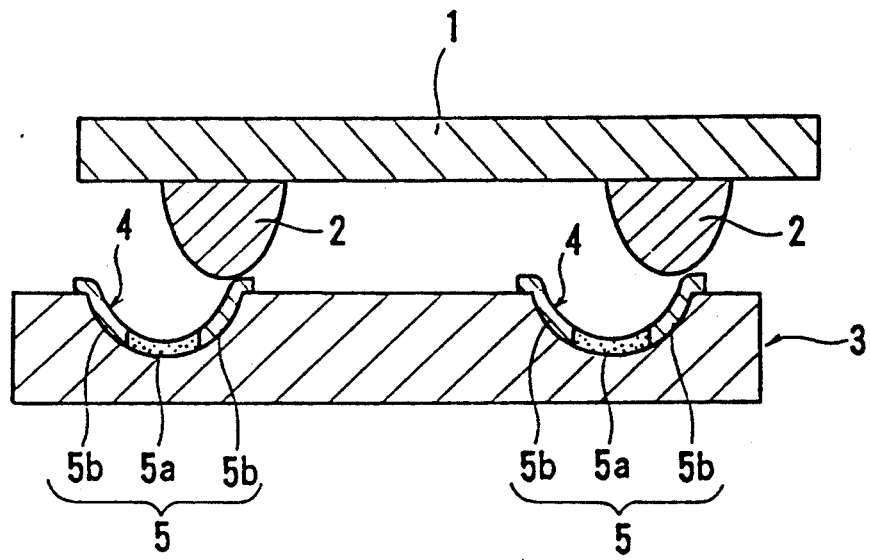
FIG. 4 shows a semiconductor device having coarsely positioned to an electrode terminal of a substrate according to the second embodiment for packaging the semiconductor device in cross section on the perpendicular direction to the substrate surface.
Figure 5:
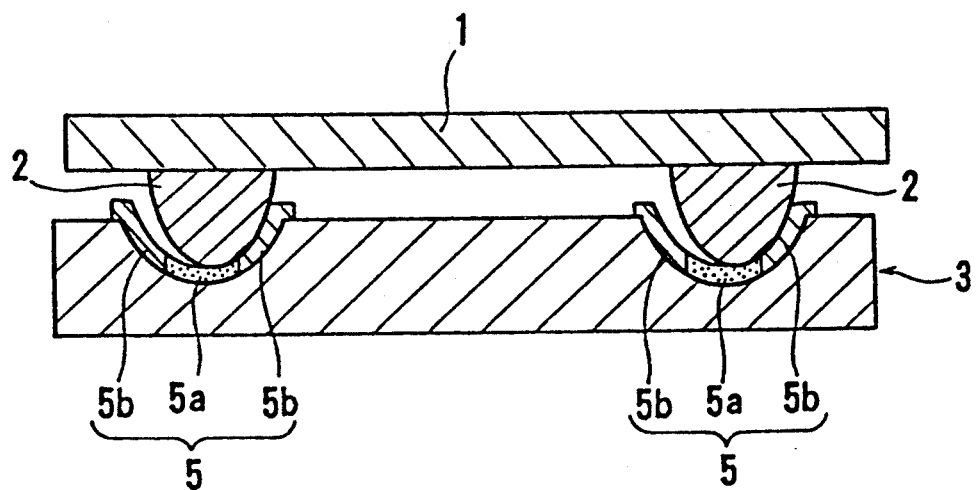
FIG. 5 shows an intermediate position of movement of a bump on the semiconductor device to a center of the electrode terminal on the substrate according to the second embodiment in cross section on the perpendicular direction to the substrate surface.
Figure 6:
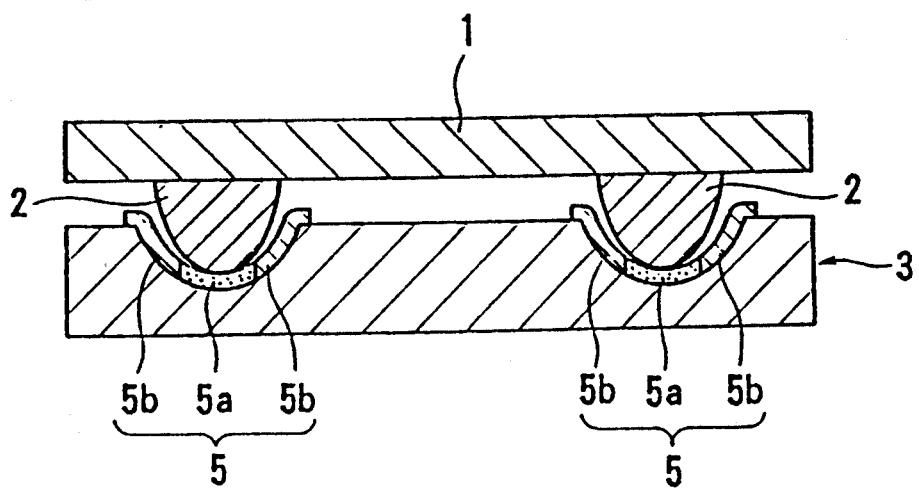
FIG. 6 shows a structure according to the second embodiment after packaging in cross section on the perpendicular direction to the substrate surface.

Next, the second embodiment of the present invention is now described with reference to FIGS. 4, 5 and 6.

As shown, a plurality of bumps 2 are formed on the surface of the semiconductor device 1 to project therefrom.

On the other hand, a plurality of electrode terminals 5 corresponding to the bumps on the semiconductor devices 1 are formed on the substrate 3 to which the semiconductor device 1 is to be packaged. Each of the electrode terminals 5 has a recess 4 formed thereon to receive at least a top of the bump 2. The recess 4 is formed in such a manner that the depth thereof gradually increases as it goes from the periphery to the center so that it is deepest at the center. The electrode terminal 5 may, for example, be formed in the following manner. First, a recess is formed at an area of the substrate 3 at which the electrode terminal 5 is to be formed.

The recess is formed to have an enough size to receive at least the top of the bump 2 formed on the semiconductor device 1. The recess is selectively metal-plated or vacuum-deposited to form the electrode terminal 5. The electrode terminal 5 thus formed has the recess 4 for receiving at least the top of the bump 2 formed thereon. A center 5a and periphery 5b of the electrode terminal 5 are separately formed, and the center 5a is made of a metal having a lower melting point than that of the periphery 5b. In the present embodiment, the center 5a is made of an alloy of Au/20% Sn, and the periphery 5b is made of Au.

When the semiconductor device 1 is to be packaged to the substrate 3 thus formed, the bump 2 on the semiconductor device 1 is positioned to the electrode terminal 5 on the substrate by a positioning machine (not shown). This positioning may be coarse to assure that a portion of the bump 2 is placed within the recess 4 as shown in FIG. 4. Because if the top of the bump 2 is positioned within a range of the recess 4 of the electrode terminal 5, the bump 2 is guided along the surface of the recess 4 of the electrode terminal 5 by lightly pushing the semiconductor device 1 to the substrate 3 after the positioning and it is automatically moved toward the center of the recess 4. However, since a frictional force acts between the bump 2 and the electrode terminal 5, the bump 2 stops at a position slightly deviated from the center of the electrode terminal 5. The center 5a of the electrode terminal 5 is made of the low melting point metal to cover the position at which the bump 2 stops, a surface tension of the molten metal acts to the bump 2 by heating the substrate 5 and melting the center 5a of the electrode terminal 5 and the bump 2 is further induced into the center of the electrode terminal 5 by the surface tension. Accordingly, as shown in FIG. 6, the bump 2 is positioned to the center of the electrode terminal 5 very precisely. The surface tension functions to minimize the surface area of the molten metal. Accordingly the semiconductor device is positioned to the substrate 3 by the surface tension so that the total positional error between the bump 2 on the semiconductor device 1 and the electrode terminal 5 on the substrate 3 is minimized. After such precise positioning, the substrate 3 may be further heated to melt the bump 2 to connect the bump 2 and the electrode terminal 5.

The size of the bump 2 formed on the semiconductor device 1 was 80 μm in diameter and approximately 30 μm in height. A size of the electrode terminal 5 on the substrate 3 was 100 μm in diameter. The semiconductor device 1 was packaged on the substrate 3. In this case, a positioning precision required for the positioning machine in order to keep the positional error between the bump 2 and the electrode terminal 5 after the packaging within ±5 μm was ±50 μm. On the other hand, the same semiconductor device as that of the above example was packaged on a prior art substrate having a flat electrode terminal of the same dimension as that of the above example. The precision required for the positioning machine was +/−5 μm. The result is shown below.

|  | Present invention | Prior art |
| --- | --- | --- |
| Precision positioning machine | +/− 50 μm | +/− 5 μm |
| Positional error after packaging | +/− 5 μm | +/− 5 μm |

Figure 7:
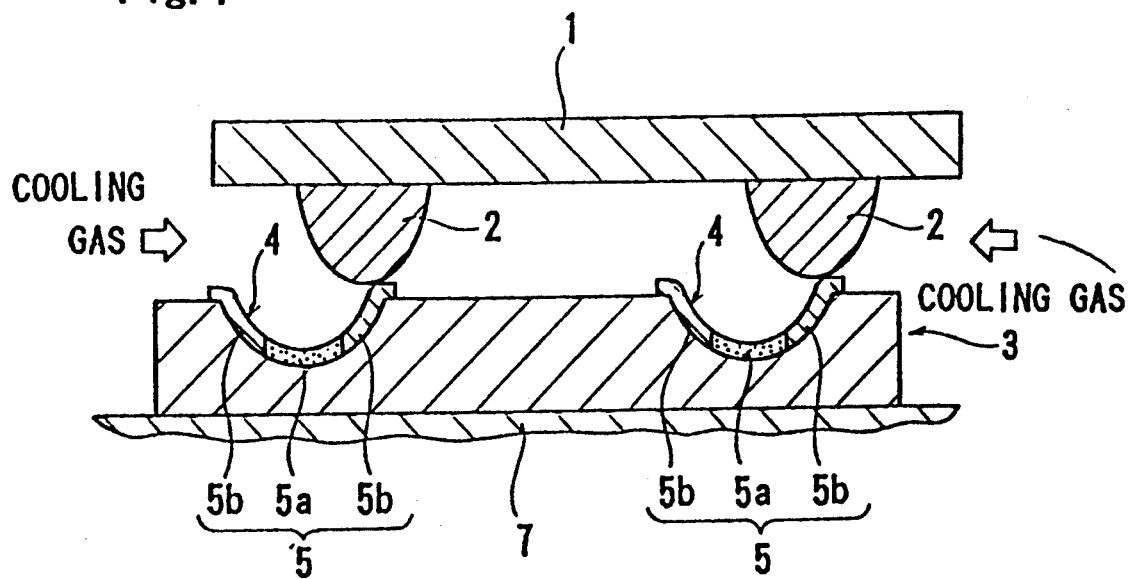
FIG. 7 shows a semiconductor device having coarsely positioned to an electrode terminal of a packaging substrate in accordance with the third embodiment in cross section on the perpendicular direction to the substrate surface.
Figure 8:
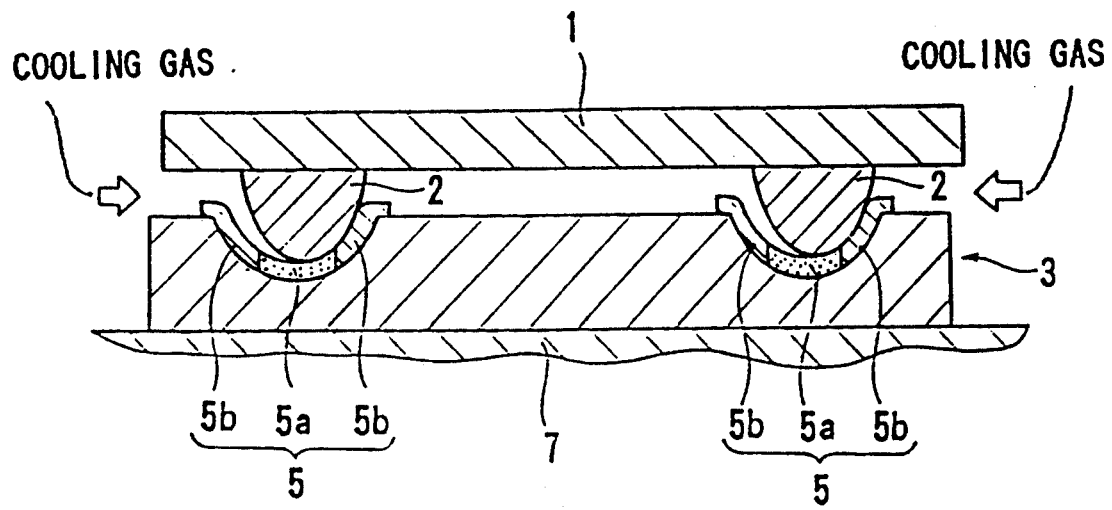
FIG. 8 shows an intermediate position of the movement of a bump on the semiconductor device to a center of the electrode terminal on the packaging substrate according to the third embodiment in cross section of a perpendicular to the substrate.
Figure 9:
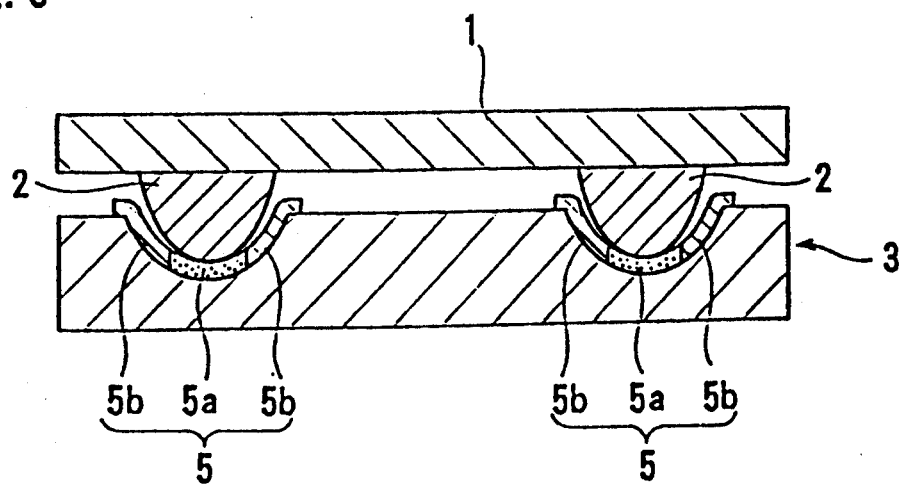
FIG. 9 shows a structure according to the third embodiment after the packaging in cross section of a perpendicular to the substrate.

Next, the third embodiment of the present invention will be explained in reference with FIGS. 7 to 9. In this embodiment, a coolant such as a cooling gas is blown into the surface on the electrode terminal 5 of the packaging substrate 3 when the substrate is heated. This is different from the above described embodiment. Where the packaging substrate 3 is heated by a hot plate 6, the control of temperature is very difficult to attain. When the packaging substrate 3 is heated, the entire electrode terminal 5 may be molten or the wiring other than the electrode may be molten. If the area other than the center 5a of the electrode terminal 5 is molten, the surface tension does not function in the manner described above and the bump 2 may not come to the center of the recess of the electrode terminal 5 or the molten electrode material may swell out to shorten an adjacent electrode. In order to avoid such problems, in the present invention, the packaging substrate 3 is heated while cooling gas is blown to the surface of the packaging substrate 3 on which the electrode terminal 5 is formed (FIG. 7). By cooling the surface of the packaging substrate by flowing the gas, it is possible to increase a temperature gradient on the surface of the packaging substrate 3. In this case, since the center 5a of the electrode terminal 5 is recessed, it is hardly blown by the cooling gas. Further, since it is on a high temperature side of the temperature gradient, only the recessed center of the electrode terminal 5 reaches a high temperature compared to other areas. Accordingly, only the low melting point metal of the center 5a of the electrode terminal 5 is molten (FIG. 8) and the bump 2 is induced into the center of the electrode terminal 5 by a surface tension (FIG. 9). The cooling gas is preferably inert gas such as $N_2$ gas. Since the packaging substrate 3 and the semiconductor device 1 face each other as shown in FIG. 7 and 8, the blowing is done to blow the gas into a gap between the semiconductor device 1 and the packaging substrate 3 from the side of the packaging substrate. A temperature of the cooling gas blown to the packaging substrate 3 may be a room temperature, but if the temperature and the blow rate of the gas are controllable, the temperature on the surface of the packaging substrate 3 can be controlled. Alternately, the positioning of the bumps and the recesses can be reversed. For example, the packaging structure of the semiconductor device could include a packaging substrate having a bump projecting from a surface thereof. An electrode pad formed on a semiconductor device can include an electrode pad having a recess for receiving at least a top of the bump projecting from the surface of the packaging substrate. Also, a conductive material of a lower melting point than that of the bump can be formed on the recess.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

We claim:

1. A substrate arrangement for packaging a semiconductor device having a bump projecting from a surface thereof comprising:
    a substrate element;
    an electrode terminal formed on said substrate element, said electrode terminal having a recess for receiving at least a top of said bump, a depth of said recess increases as it goes from a periphery to a center; and
    a conductive member of a lower melting point than that of the peripheral portion of said electrode is formed at the central portion of the recess of said electrode terminal.

2. A substrate arrangement for packaging a semiconductor device according to claim 1 wherein said conductive member is a metal layer.

3. A substrate arrangement for packaging a semiconductor device having a bump projecting from a surface thereof,
    a substrate element, said substrate element having a recess for receiving at least a top of said bump;
    an electrode terminal formed in said recess of said substrate element, said electrode terminal having a recess, a central portion of said electrode terminal is made of a material having a lower melting point than that of a material of a peripheral portion of said electrode.

4. A substrate arrangement for packaging a semiconductor device according to claim 3 wherein said electrode terminal is formed by selective plating.

5. A packaging structure of a semiconductor device comprising:
   a semiconductor device having a bump projecting from a surface thereof;
   a substrate element; and
   an electrode terminal formed on said substrate element, said electrode terminal having a recess for receiving at least a top of said bump, said electrode terminal further including a conductive material of a lower melting point than that of said bump,
   wherein said conductive material is formed at a central portion of said recess and a member of a higher melting point than that of said conductive material is formed in a peripheral portion of said recess.

6. A packaging structure of a semiconductor device comprising:
   a packaging substrate having a bump projecting from a surface thereof;
   a semiconductor device;
   an electrode pad formed on said semiconductor device said electrode pad having a recess for receiving at least a top of said bump; and
   a conductive material of a lower melting point than that of said bump is formed on said recess.

7. A substrate arrangement for packaging a semiconductor device according to claim 1, wherein said recess is of substantially sphere shape having a larger dimension than that of said top of said bump.

8. A substrate arrangement for packaging a semiconductor device according to claim 7, wherein said conductive member is a metal layer.

9. A substrate arrangement for packaging a semiconductor device according to claim 8, wherein said metal layer is coated on the surface of said recess.

10. A substrate arrangement for packaging a semiconductor device according to claim 3, wherein said recess of said electrode is of substantially sphere shape having a larger dimension than that of said top of said bump.

11. A substrate arrangement for packaging a semiconductor device according to claim 10, wherein said conductive member is a metal layer.

12. A substrate arrangement for packaging a semiconductor device according to claim 11, wherein said metal layer is coated on the surface of said recess.

13. A packaging structure of a semiconductor device comprising:
    a semiconductor device having a bump projecting from a surface thereof;
    a substrate element; and
    an electrode terminal formed on said substrate element, said electrode terminal having a recess for receiving at least a top of said bump, said electrode terminal further including a conductive material of a lower melting point than that of said bump,
    wherein a depth of said recess increases from a periphery to a center, said recess being substantially sphere shaped having a larger radius of curvature than that of said top of said bump, and the central portion of said electrode terminal is made of a conductive member having a lower melting point than that of the peripheral portion of said electrode terminal.

14. A substrate for packaging a semiconductor device according to claim 13, wherein said conductive member is a metal layer.

15. A substrate for packaging a semiconductor device according to claim 14, wherein said metal layer is coated on the surface of said recess.

* * * * *